(12) United States Patent
Huang et al.

(10) Patent No.: US 7,312,997 B2
(45) Date of Patent: Dec. 25, 2007

(54) HEAT-DISSIPATION DEVICE WITH ELASTIC MEMBER AND HEAT-DISSIPATION METHOD THEREOF

(75) Inventors: Yu-Nien Huang, Chung Li (TW); Shun-Ta Yu, Taipei (TW); Cheng-Yu Wang, Hsinchu (TW); Jim-Fat Tseng, Kaohsiung (TW); Tsan-Nan Chien, Taipei (TW); Yu Liu, Tao Yuan (TW)

(73) Assignee: Quanta Computer Inc., Tao Yuan Shien (TW)

( * ) Notice: Subject to any disclaimer, the term of this patent is extended or adjusted under 35 U.S.C. 154(b) by 55 days.

(21) Appl. No.: 11/189,496

(22) Filed: Jul. 26, 2005

(65) Prior Publication Data

US 2006/0238981 A1    Oct. 26, 2006

(30) Foreign Application Priority Data

Apr. 22, 2005    (TW) ............................ 94112886 A

(51) Int. Cl.
*H05K 7/20*    (2006.01)
*F28D 15/00*    (2006.01)

(52) U.S. Cl. ................. 361/704; 361/710; 165/104.33; 165/185; 248/510

(58) Field of Classification Search ................ 361/700, 361/712, 704, 719, 687–718; 257/727, 718–719, 257/720; 165/104.33, 185; 248/505, 510
See application file for complete search history.

(56) References Cited

U.S. PATENT DOCUMENTS 4,235,285 A * 11/1980 Johnson et al. ............ 165/80.3
4,246,597 A * 1/1981 Cole et al. .................. 257/713
6,301,107 B1 * 10/2001 Lev et al. .................... 361/687
6,328,097 B1 * 12/2001 Bookhardt et al. .... 165/104.33
6,345,664 B1 * 2/2002 Katsui ........................ 165/80.3
6,347,036 B1 * 2/2002 Yeager et al. ............... 361/687
6,366,460 B1 * 4/2002 Stone et al. ................. 361/687
6,400,565 B1 * 6/2002 Shabbir et al. ............. 361/687
6,442,025 B2 * 8/2002 Nakamura et al. .......... 361/695
6,504,720 B2 * 1/2003 Furuya ....................... 361/699
6,570,761 B2 * 5/2003 Stone et al. ................. 361/687
6,708,754 B2 * 3/2004 Wei .............................. 165/46
6,883,594 B2 * 4/2005 Sarraf et al. ............ 165/104.33

FOREIGN PATENT DOCUMENTS

TW       200501366       6/2006

OTHER PUBLICATIONS

Taiwan Office Action mailed Oct. 31, 2006.

* cited by examiner

*Primary Examiner*—Jayprakash Gandhi
*Assistant Examiner*—Robert J Hoffberg
(74) *Attorney, Agent, or Firm*—Thomas, Kayden, Horstemeyer & Risley

(57) ABSTRACT

The invention provides a heat-dissipation device and a heat-dissipation method thereof. The electronic device includes a heat source, a thermal interface material (TIM) in contact with the heat source, a heat-dissipation module in contact with the thermal interface material, and an elastic member pushing the heat-dissipation module toward the heat source. The elastic member includes a base and a compressible portion extending from the base, whereby a force, applied to the compressible portion, is transmitted to and uniformly distributed on the base. The heat-dissipation method includes the steps of overlapping a thermal interface material and a heat-dissipation module on the heat source, and exerting a force toward the heat source to the heat-dissipation module.

6 Claims, 5 Drawing Sheets

HEAT-DISSIPATION DEVICE WITH ELASTIC MEMBER AND HEAT-DISSIPATION METHOD THEREOF

BACKGROUND

The present invention relates in general to a heat-dissipation device, and in particular to a heat-dissipation device with an elastic member and a heat-dissipation method thereof applied to an electronic device.

With the progress of computer technology, a bus and a chip speed have increased greatly, thus, computer efficiency has improved. With computer efficiency improving, heat-dissipation problem becomes important to be solved. Chips other than the central processing unit (CPU), such as north bridge and a display chip require enhanced heat-dissipation efficiency. A conventional heat-dissipation module typically emphasizes heat convection, while ignoring heat conduction ability. FIG. 1 illustrates the relationship between contact force and thermal resistance. When contact force is greater, thermal resistance is lower. For this reason, increasing the contact force can achieve a better heat-dissipation.

SUMMARY

Accordingly, the invention provides a heat-dissipation device with an elastic member and a heat-dissipation method thereof.

The elastic member comprises a base, and a compressible portion disposed on the base. When a shell presses on the compressible portion, the compressible portion generates a compression stroke to make the base forced uniformly.

The compressible portions are extended curvedly and upward from two sides of the base. The base comprises two fixing portions disposed on two sides of the base. The base further comprises a convex passage approximately.

The heat-dissipation device comprises a heat source, a thermal interface material contacting the heat source, a heat-dissipation module contacting the thermal interface material, and an elastic member supporting the heat-dissipation module toward the heat source.

The steps of the heat-dissipation method comprise overlapping a thermal interface material and a heat-dissipation module on the heat source, and exerting a force toward the heat source to the heat-dissipation module.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1:
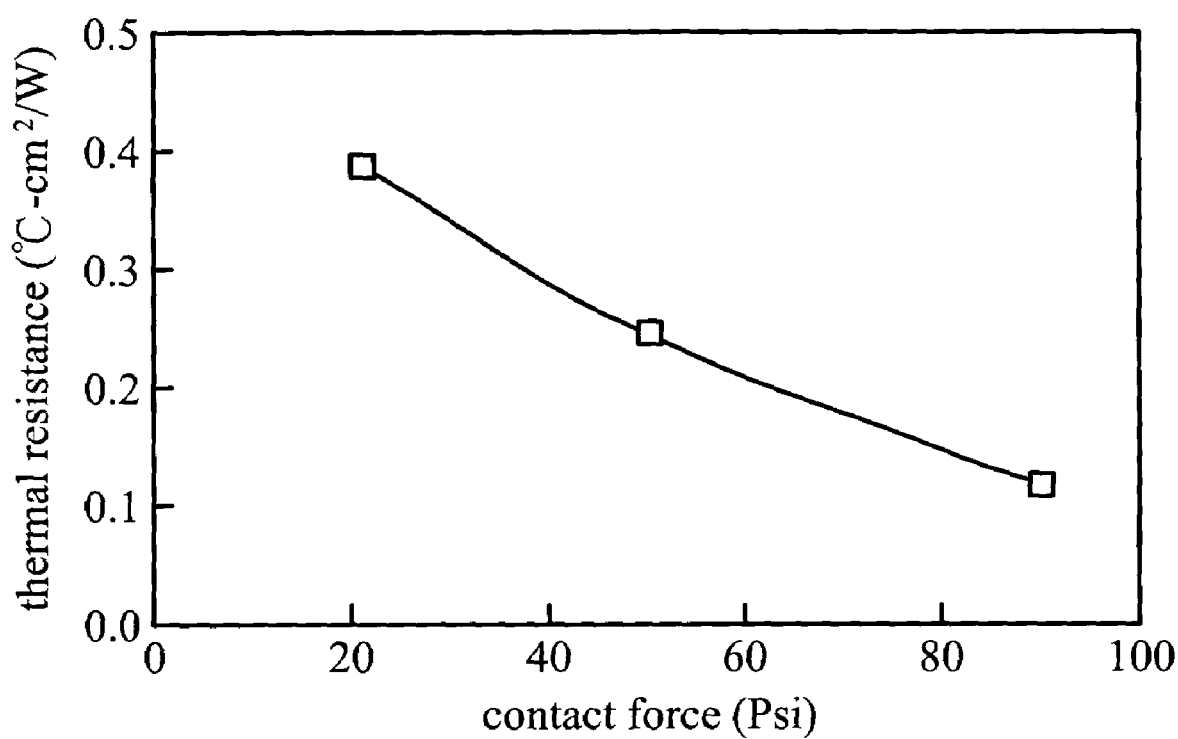
FIG. 1 is the relationship diagram of a contact force and a thermal resistance.
Figure 2:
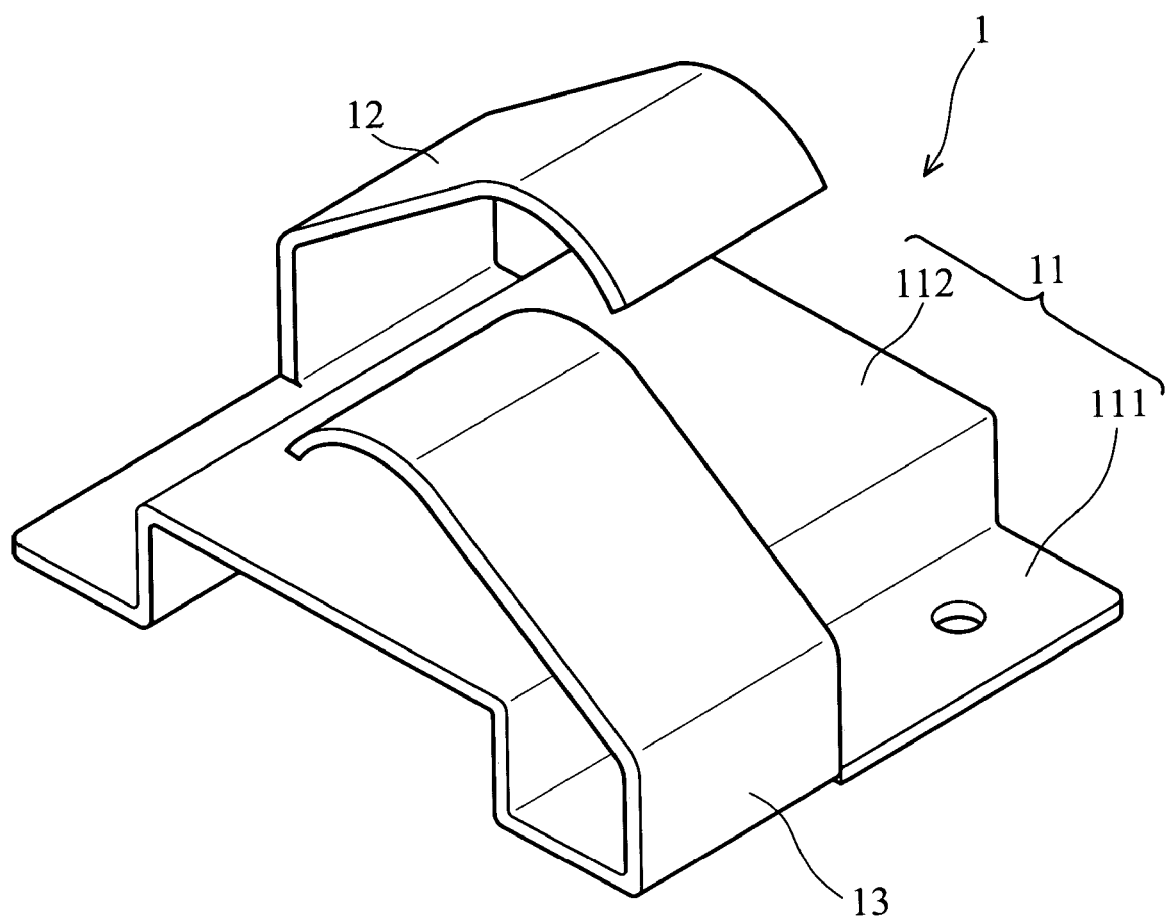
FIG. 2 shows a schematic diagram of an elastic member.

Referring to FIG. 2, an elastic member 1 comprises a base 11 and two compressible portions 12, 13. The base 11 comprises two fixing portions 111 and a passage 112. The fixing portions 111 are disposed on two sides of the base 11. In this embodiment, the compressible portions 12, 13 are convex, alternately arranged, and extended curvedly and upward from two sides 111 of the base 11 to the center portion 112 of the base 11. The cross section of the passage 112 is substantially π-shaped, allowing a heat pipe 22 (shown in FIG. 3) to pass therethrough.

Figure 3:
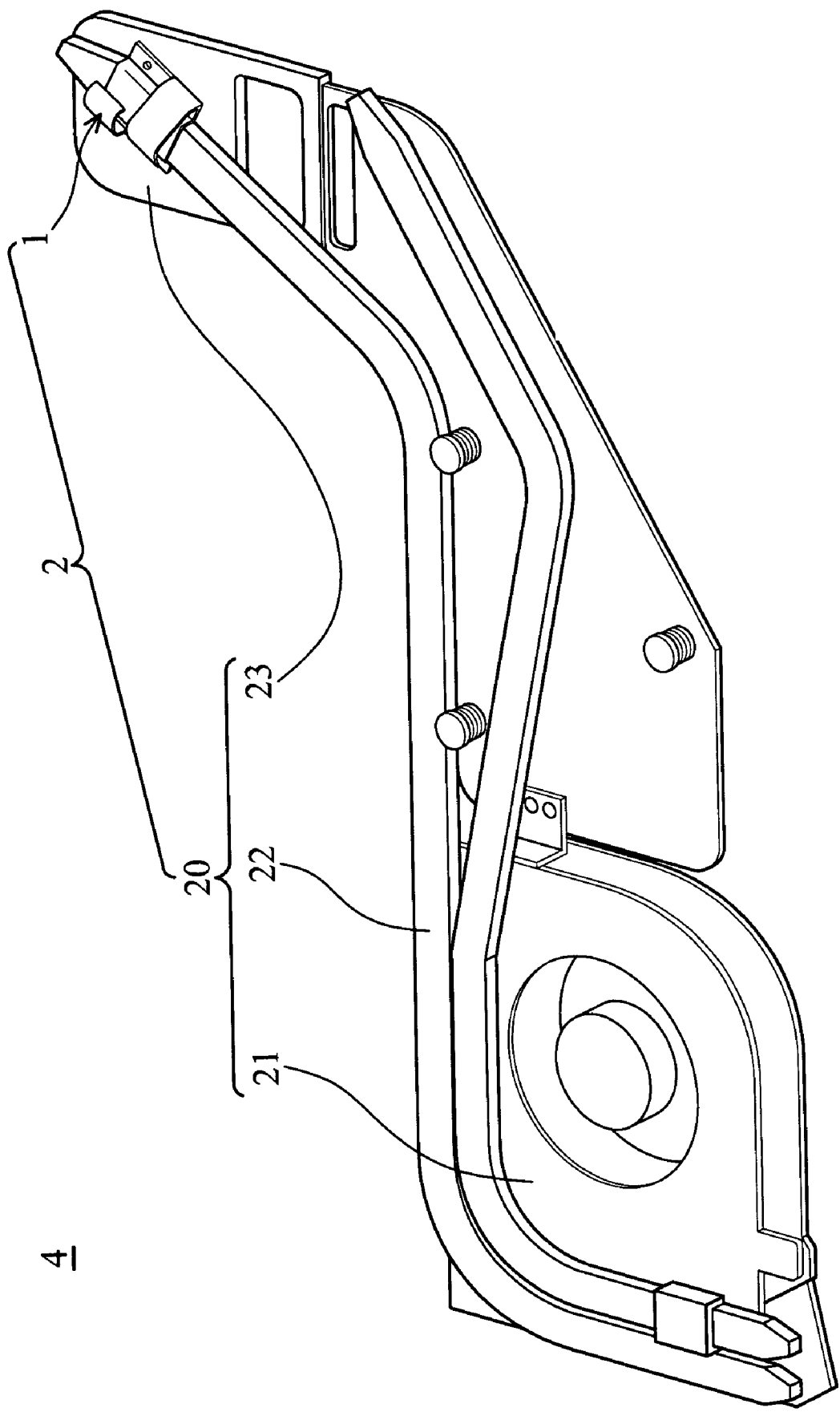
FIG. 3 shows a use case diagram of an elastic member.
Figure 4:
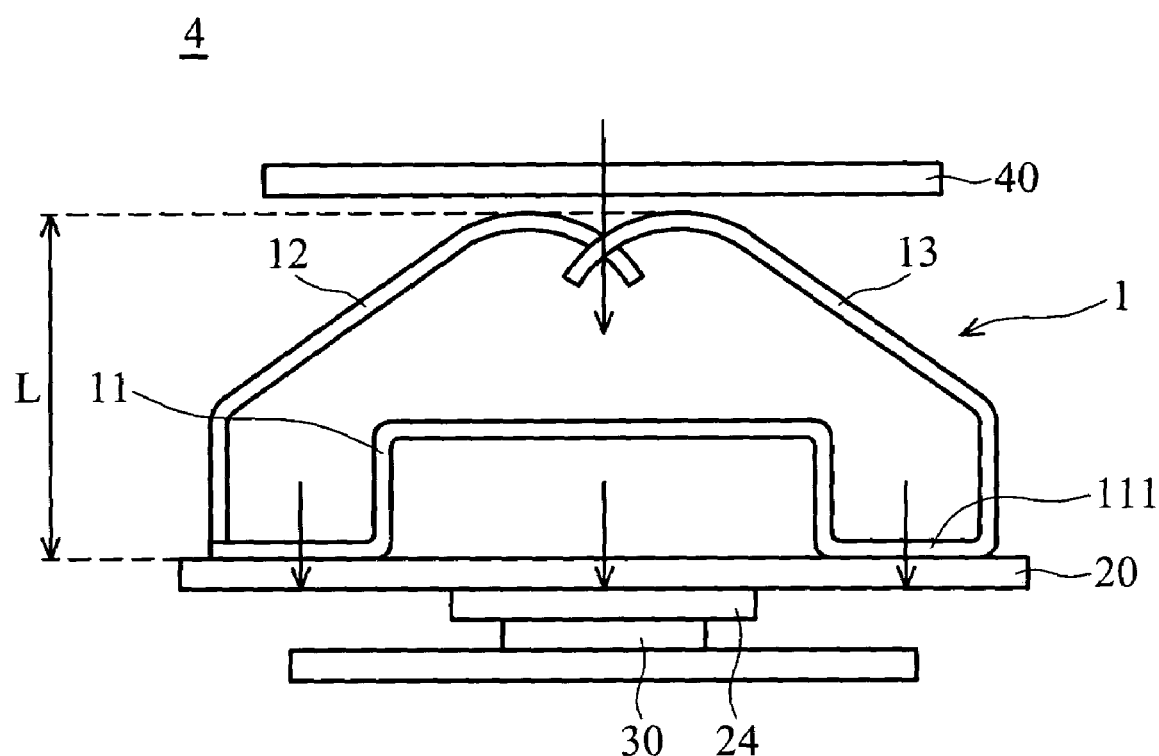
FIG. 4 is a use case diagram of an elastic member applied to an electronic device.

Referring to FIGS. 3 and 4, the heat-dissipation device 2 is installed in an electronic device 4. The heat-dissipation device 2 comprises a heat-dissipation module 20 and the elastic member 1. The heat-dissipation module 20 comprises a fan 21, the heat pipe 22, and a thermal block 23. The thermal block 23 is installed on/over the heat source 30 (for example a heat-dissipation chip) via a thermal interface material 24. The elastic member 1 is fixed on the heat pipe 22 of the heat-dissipation module 20 through the fixing portions 111 by welding, riveting, or screws. A distance L (shown in FIG. 4) exists between the top of the compressible portions 12, 13 and the bottom of the elastic member 1. The elastic member 1 is forced by the shell 40 above the elastic member 1. When the elastic member 1 is pressed, the compressible portions 12, 13 generate a compression stroke to absorb the force from the shell 40. Moreover, a change to the thickness L of the elastic member 1 can affect the compression stroke to change the contact force between the heat source 30 and the heat-dissipation module 20. Furthermore, the invention also can be applied to a heat-dissipation fin to promote the heat-dissipation efficiency via the above principle.

Figure 5:
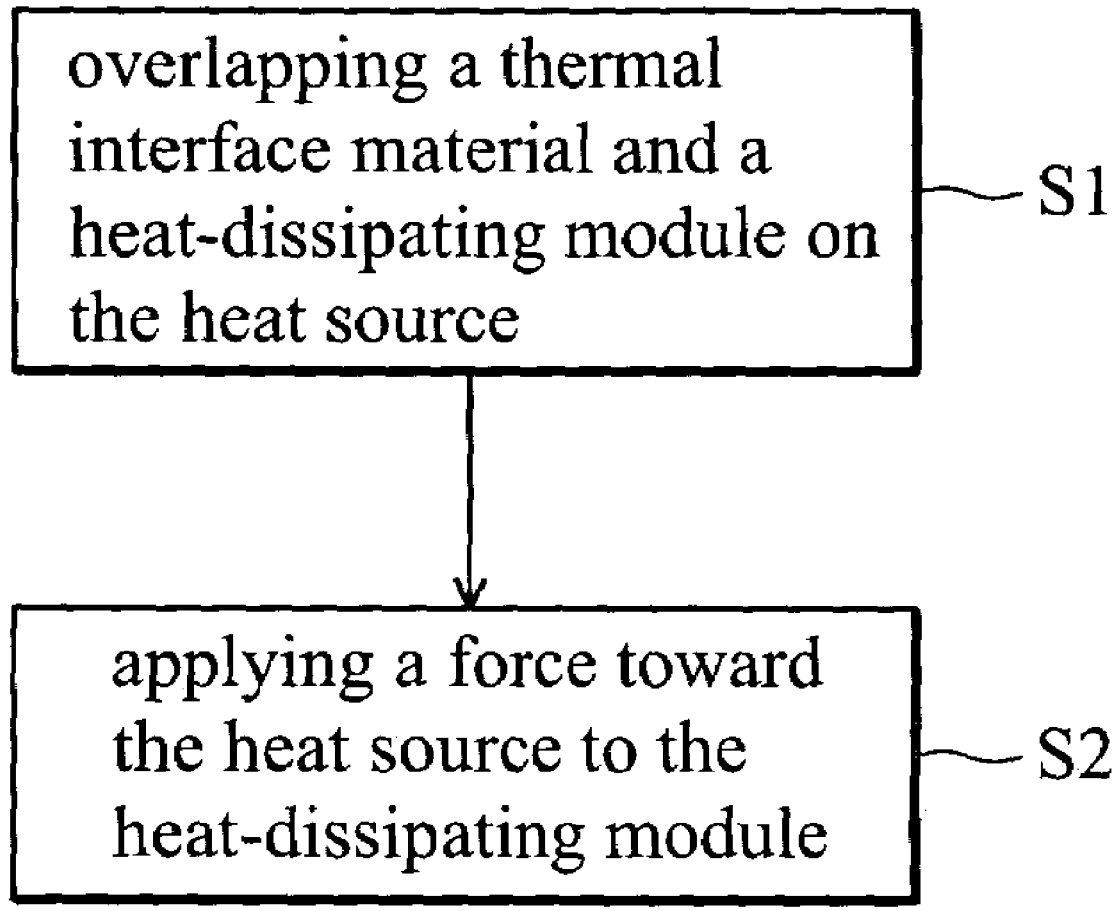
FIG. 5 is a flowchart of a heat-dissipation method.

FIG. 5 illustrates a flow chart of a heat-dissipation method. A thermal interface material 24 and a heat-dissipation module 20 are overlapped on the heat source in order (S1 step). An elastic member 1 is presses against the heat-dissipation module 20 and the heat source 30 (S2 step). The S2 step increases the contact force between the heat source 30, thermal interface material 24, and the heat-dissipation module 20 to decrease the thermal resistance promoting heat-dissipation efficiency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat-dissipation device applied to an electronic device, comprising:

a heat source;

a thermal interface material contacting the heat source;

a heat-dissipation module contacting the thermal interface material; and an elastic member supporting the heat-dissipation module toward the heat source, comprising:

a base, comprising two fixing portions disposed on two sides of the base; and at least a compressible portion disposed on the base;

wherein when a force is applied to the elastic member, the compressible portion absorbs the force to make the base force uniform, thereby decreasing the thermal resistance of the heat-dissipation module; and the compressible portion is disposed above the base and one of two ends of the compressible portion is connected to the base.

2. The heat-dissipation device as claimed in claim 1, further comprising a shell containing the heat source, the thermal interface material, the heat-dissipation module, and the elastic member.

3. The heat-dissipation device as claimed in claim 2, wherein the elastic member supports the shell and the heat-dissipation module.

4. The heat-dissipation device as claimed in claim 1, wherein the elastic member further comprises two compressible portions extended curvedly and upward from two sides of the base.

5. The heat-dissipation device as claimed in claim 1, wherein the base further comprises a U-shape.

6. The heat-dissipation device as claimed in claim 1, wherein the compressible portion is convex.

* * * * *